United States Patent
Zheng et al.

(10) Patent No.: US 6,551,893 B1
(45) Date of Patent: Apr. 22, 2003

(54) ATOMIC LAYER DEPOSITION OF CAPACITOR DIELECTRIC

(75) Inventors: Lingyi A. Zheng, Boise, ID (US); Er-Xuan Ping, Meridian, ID (US); Lyle Breiner, Meridian, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/994,547

(22) Filed: Nov. 27, 2001

(51) Int. Cl.⁷ ............................................. H01L 21/20
(52) U.S. Cl. ................. 438/387; 438/386; 438/765; 438/769; 438/778; 438/763; 438/396
(58) Field of Search .................. 438/396, 386, 438/387, 391, 765, 769, 778, 761, 762, 763

(56) References Cited

U.S. PATENT DOCUMENTS

| | | | |
|---|---|---|---|
| 5,624,865 | A | 4/1997 | Schuegraf et al. |
| 6,042,652 | A | 3/2000 | Hyun et al. |
| 6,175,129 | B1 | 1/2001 | Liu et al. |
| 6,207,494 | B1 | 3/2001 | Graimann et al. |
| 2001/0024387 | A1 * | 9/2001 | Raaijmakers et al. ....... 365/200 |
| 2002/0047151 | A1 * | 4/2002 | Kim et al. .................. 257/301 |
| 2002/0068466 | A1 * | 6/2002 | Lee et al. ................... 438/765 |

OTHER PUBLICATIONS 0.13 um CMOS Device Characteristics, http://www.semi-conductor.net/semiconductor/issues/issues/2000/200001/images/Six0001, Jul. 31, 2001, p. 1.

Peter Singer, Atomic Layer Deposition Targets Thin Films, Semiconductor International–Sep. 1999, Technology News, p. 1,2.

ALD Products, ALD Products GENUS, About Genus/Investor Relatins/News/Careers/Support & Training/ALD Products/CVD Products/Markets/Site Index/Glossary/Home/Legal Notices/Copyright 2001 Genus Inc. p. 1.

* cited by examiner

Primary Examiner—Amir Zarabian
Assistant Examiner—Khanh B. Duong
(74) Attorney, Agent, or Firm—Killworth, Gottman, Hagan & Schaeff, L.L.P.

(57) ABSTRACT

A capacitor structure is formed over a semiconductor substrate by atomic layer deposition to achieve uniform thickness in memory cell dielectric layers, particularly where the dielectric layer is formed in a container-type capacitor structure. In accordance with several embodiments of the present invention, a process for forming a capacitor structure over a semiconductor substrate is provided. Other embodiments of the present invention relate to processes for forming memory cell capacitor structures, memory cells, and memory cell arrays. Capacitor structures, memory cells, and memory cell arrays are also provided.

21 Claims, 5 Drawing Sheets

ATOMIC LAYER DEPOSITION OF CAPACITOR DIELECTRIC

BACKGROUND OF THE INVENTION

The present invention relates to memory cell capacitor structures and, more particularly, to a fabrication process where a capacitor dielectric is formed by atomic layer deposition.

Silicon nitride is commonly employed as the dielectric in memory cell capacitor structures. Unfortunately, conventional process technology is limited in its ability to manufacture suitable reduced-thickness dielectric layers with good uniformity. Accordingly, there is a need for an improved memory cell capacitor dielectric layer manufacturing process.

BRIEF SUMMARY OF THE INVENTION

This need is met by the present invention wherein a capacitor dielectric is formed by atomic layer deposition. The present inventors have recognized that it is difficult to achieve uniform thickness in memory cell dielectric layers, particularly where the dielectric layer is formed in a container-type capacitor structure. The present invention is also applicable to trench-type capacitor structures. Generally, as device size shrinks, thinner dielectric layers are needed to ensure adequate memory cell capacitance. As dielectric layer thickness decreases, non-uniformity leads to reoxidation punch-through and corresponding device degradation. Also, as the dielectric layer thickness decreases, the leakage current attributable to the dielectric layer tends to increase dramatically, deteriorating device performance.

The present invention addresses these problems by providing a manufacturing process where the dielectric layer is formed through atomic layer deposition (ALD). In accordance with several embodiments of the present invention, a process for forming a capacitor structure over a semiconductor substrate is provided. Other embodiments of the present invention relate to processes for forming memory cell capacitor structures, memory cells, and memory cell arrays. Capacitor structures, memory cells, and memory cell arrays are also provided. Accordingly, it is an object of the present invention to provide an improved memory cell capacitor dielectric layer manufacturing process. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
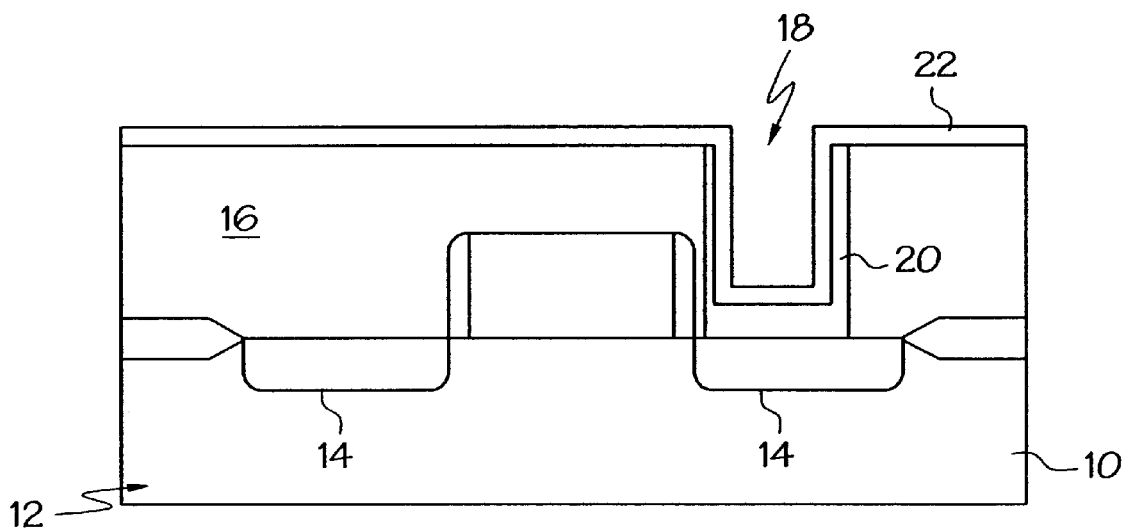
FIGS. 1 and 2 illustrate a memory cell capacitor structure fabrication scheme according to one embodiment of the present invention.
Figure 2:
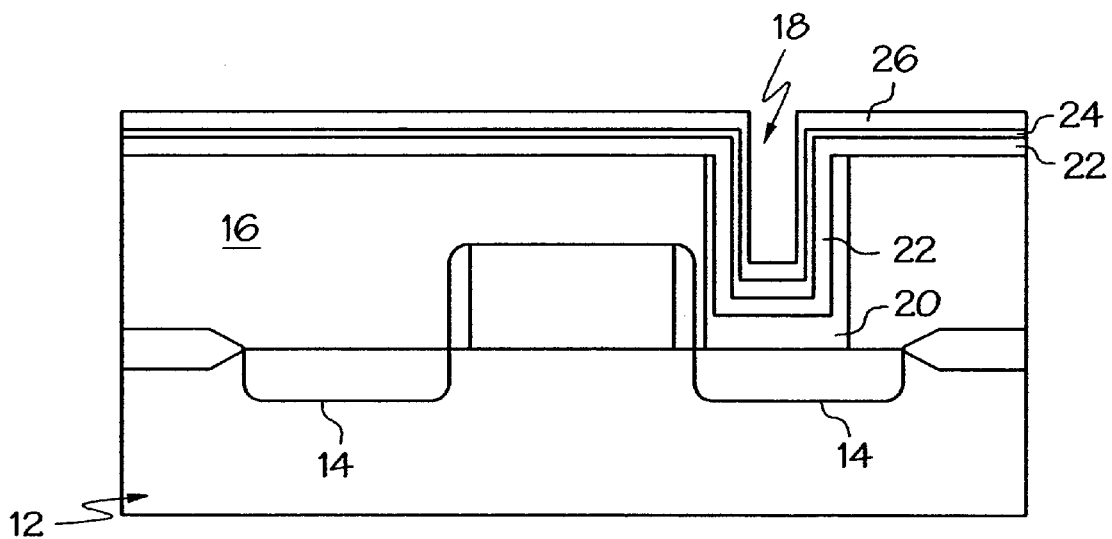

Referring to FIGS. 1 and 2, according to one embodiment of the present invention, a capacitor structure of a memory cell may be formed by providing a semiconductor substrate 10 including a semiconductor structure defining a transistor 12 and a pair of transistor node locations 14. An insulating layer 16, e.g. a BPSG layer, is formed over the semiconductor substrate 10. A container 18 is formed in the insulating layer 16 over one of the transistor node locations 14. A lower electrode layer 20, typically a HSG polysilicon layer, is formed along an inner surface of the container 18. A dielectric layer 22 is formed on the lower electrode layer 20 and over a portion of an upper surface of the insulating layer 16. A reoxidized layer 24 is formed over the dielectric layer 22 by subjecting the dielectric layer 22 to a reoxidation process. Finally, an upper electrode layer 26, typically a polysilicon layer, is formed over the reoxidized layer 24, typically covering the entire dielectric layer 22.

The lower electrode layer 20 typically covers the entire inner surface of the container 18. The dielectric layer 22, which is typically formed directly on the lower electrode layer 20, completely covering the lower electrode layer 20, exhibits uniform thickness across the lower electrode layer 20 and the upper surface of the insulating layer 16. The dielectric layer 22 is formed such that the uniform thickness is sufficient to prevent punch-thru oxidation, i.e., incidental oxidation of the lower electrode layer 20 during reoxidation of the dielectric layer and other device components. As will be appreciated by those practicing the present invention and familiar with semiconductor device fabrication, a reoxidation step is commonly incorporated in semiconductor device fabrication schemes.

The dielectric layer 22 is formed through an atomic layer deposition (ALD) process. The thickness of a silicon nitride dielectric layer is typically 50 angstroms or less. Conventional process technology, such as low pressure chemical vapor deposition (LPCVD) is not well-suited for fabrication of silicon nitride dielectric layers of such thicknesses because dielectric quality deterioration and oxidation punch-through become problems at layer thicknesses of 50 angstroms or less. Oxidation punch-through of LPCVD silicon nitride dielectric layers occurs because the silicon nitride on the underlying BPSG insulating layer is thinner than that on the HSG lower electrode. The difference in thickness is attributable to the difference in LPCVD nucleation incubation times for silicon nitride over BPSG and HSG, respectively. Specifically, the nucleation incubation time is longer for silicon nitride on BPSG than for silicon nitride on HSG. Data has also shown that the quality of the silicon nitride layer formed according to the present invention is superior to that of the silicon nitride layer formed by the LPCVD method. Therefore, according to the present invention, capacitor performance is maintained even as the dielectric thickness goes below 50 angstroms.

According to the deposition process of the present invention, a first precursor, e.g., a silicon-containing precursor, is chemisorbed over a surface of the lower electrode layer 20 and the upper surface of the insulating layer 16. A second precursor, e.g., a nitrogen-containing precursor, is then reacted with the chemisorbed precursor to form the dielectric layer 22, e.g., a silicon nitride dielectric layer. The specific processing steps utilized to introduce the first and second precursors and cause their chemisorption/reaction are beyond the scope of the present invention and may be gleaned from any one of a number of teachings related to atomic layer deposition. For the purposes of describing and defining the present invention, it is noted that the precise mechanism by which the molecules of the first precursor adhere to the surface of the semiconductor substrate is not the subject of the present invention. The mechanism is merely described herein as chemisorption—a term intended to cover absorption, adsorption, and any other similar mechanisms by which the precursor may form a monolayer upon the surface of the semiconductor substrate 10.

Generally, in atomic layer deposition, assuming that two precursor gases A and B are used, precursor gas A is introduced into a reaction chamber of an ALD device and atoms of the precursor gas A are chemisorbed on a substrate in the chamber. Next, un-absorbed presursor gas A is purged with an inert gas such as Ar or nitrogen $N_2$ and presursor gas B flows into the chamber. A chemical reaction between the precursor gases A and B occurs only on the surface of the substrate on which the precursor gas A has been adsorbed, resulting in formation of an atomic layer on the substrate. Un-reacted precursor gas B and the by-products of the reaction between two gases A and B are purged. The thickness of the film can be increased by repeating these steps to deposit successive atomic layers. In this manner, the thickness of the thin film can be adjusted in atomic layer units according to the number of repetitions. Atomic layer deposition processes according to the present invention are typically characterized by semiconductor substrate temperatures of between about 350 to about 700° C. and reactor chamber pressures of about 1 to 120 Torr. A substantially flat temperature distribution can be maintained across the semiconductor substrate as the first precursor is chemisorbed and the second precursor is reacted with the chemisorbed precursor.

The ALD method, when used for depositing a thin film on a substrate, can ensure near perfect step coverage regardless of the morphology of the substrate. The composition of the atomic layer depends upon the nature of the reaction between the precursor gases A and B. In the present invention, where the object is to form a silicon nitride film in a capacitor structure, the first precursor gas typically comprises a silicon-containing gas and the second precursor gas typically comprises a nitrogen-containing gas. Suitable silicon-containing precursors include, but are not limited to, $SiCl_4$, $SiHCl_3$, $SiH_2Cl2$, $Si_2H_6$, $SiCl_6$, and $SiH_4$. Suitable nitrogen-containing precursors include, but are not limited to, $NH_3$ and $N_2H_2$.

In some cases, for example where $N_2H_2$ is utilized as the precursor, it may be helpful to generate a plasma in the reaction chamber to help break-up the precursor, generating nitrogen radicals encouraging reaction of the two precursors at the surface of the substrate on which the layer is to be formed. Alternatively, a laser source or an infrared radiation source may be employed to help generate nitrogen radicals. Use of the plasma, the laser source, or the infrared radiation source also allows the process to operate at reduced chamber and substrate temperatures.

Figure 5:
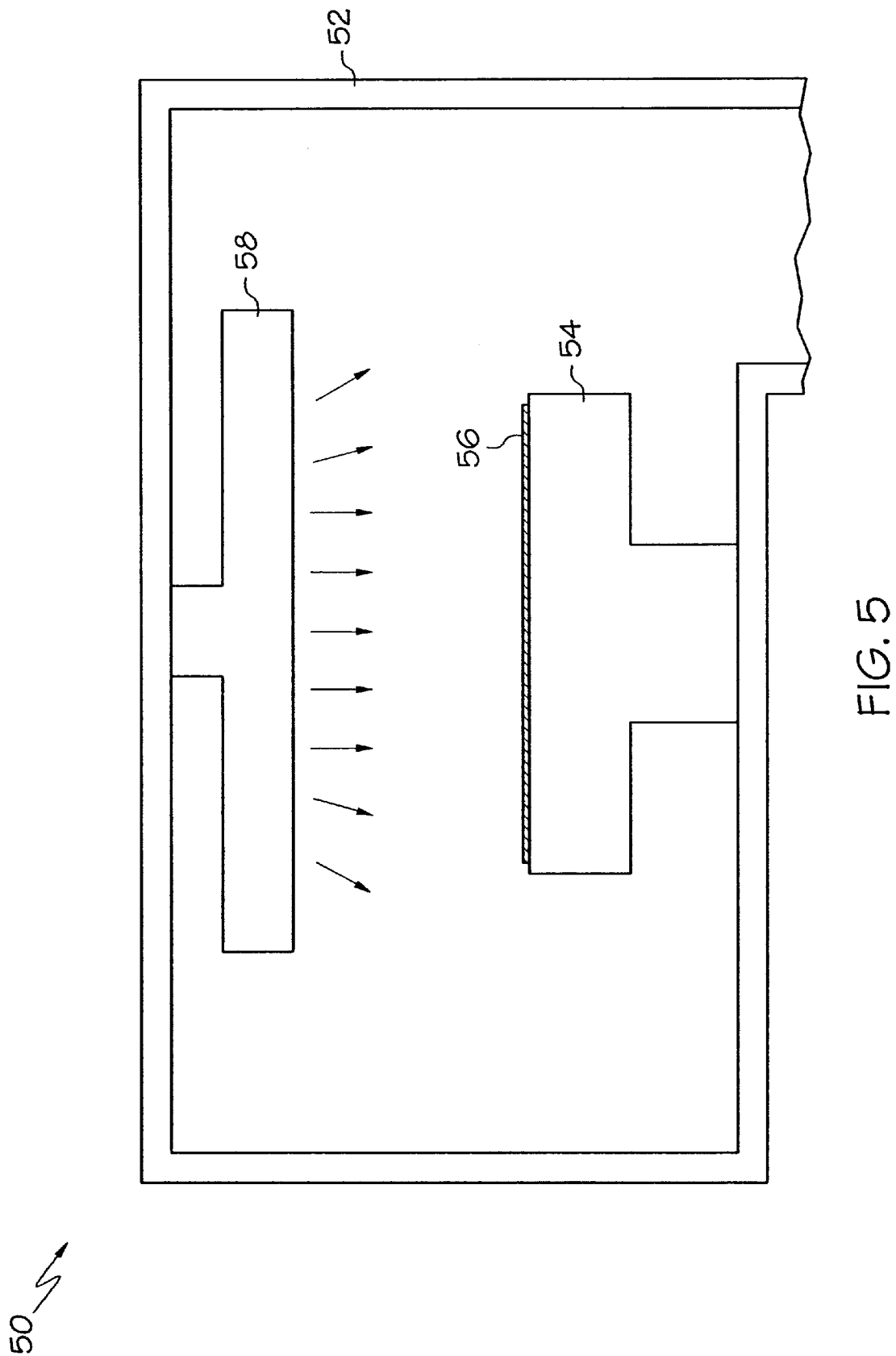
FIG. 5 is a schematic diagram of an ALD apparatus according to the present invention.

FIG. 5 is a schematic diagram of a single wafer process ALD apparatus 50 according to the present invention. As shown in FIG. 5, the ALD apparatus comprises a vacuum chamber 52 and a heater 54 for heating a substrate 56 placed in the vacuum chamber 52 to an appropriate temperature. The substrate 56 is seated on a substrate holder (not shown) placed on top of the heater 54, and heated evenly by the heater 54. Also, a showerhead 58 through which a predetermined precursor gas flows into the vacuum chamber 52, is installed facing the surface of the substrate 56.

Figure 6:
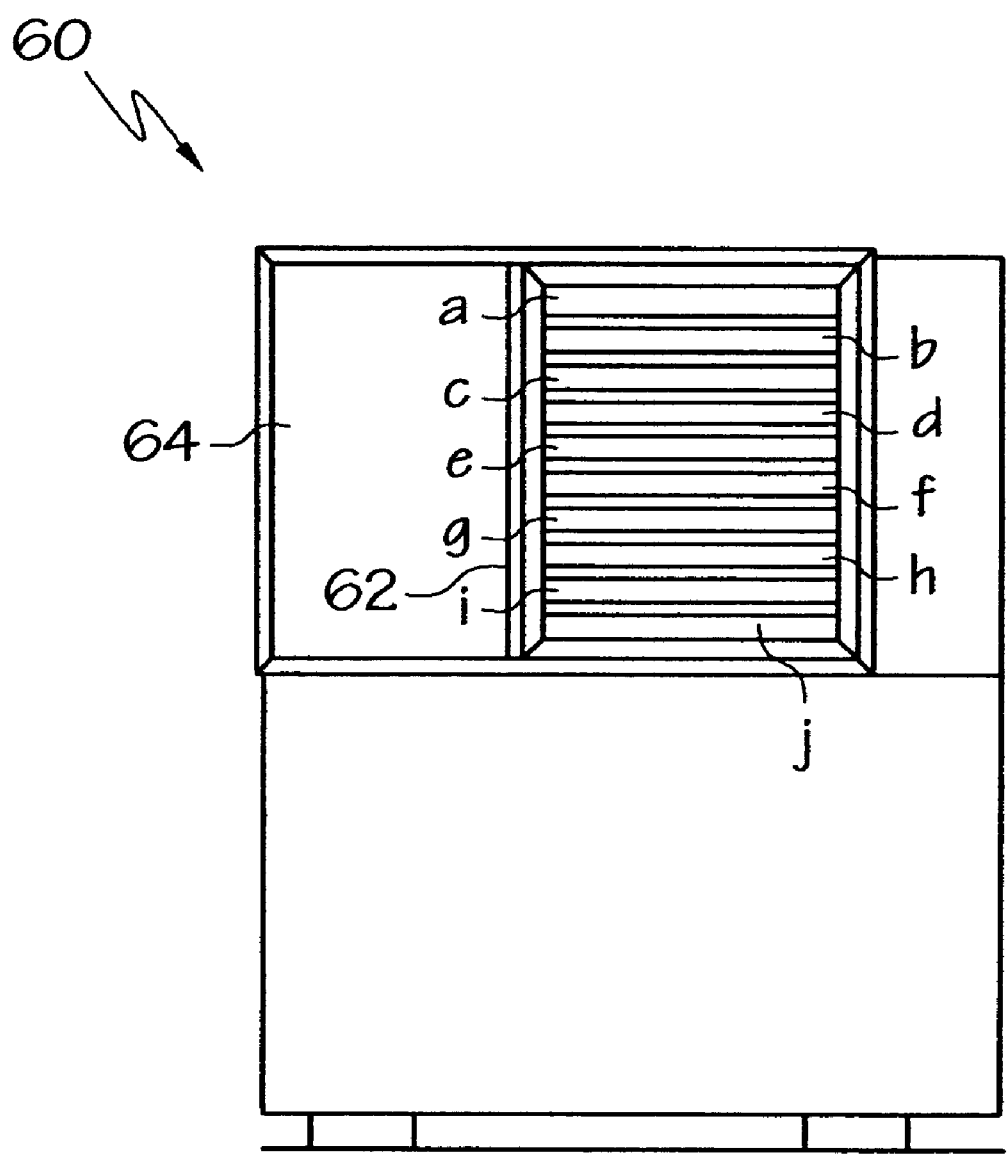
FIG. 6 is an elevation view of an ALD apparatus for a large-scale production system according to present invention.

The present invention can be utilized in any standard hot wall batch-type ALD furnace. Batch type furnaces enable processing of multiple wafers in a single batch process, increasing manufacturing throughput. FIG. 6 is an elevation view of an batch-type ALD apparatus 60 for a large-scale production system according to present invention. In this embodiment, preprocessed substrates a-j are loaded onto a cassette or stacking mechanism 62 in a reaction chamber 64 of the ALD apparatus 60 through a cassette load lock (not shown). Alternatively, an entire cassette of substrates may be introduced into the chamber 64. Specific structure for accomplishing this sort of loading and interfacing is well-known in the art of production systems. Once loaded the substrates a-j are subject to processing according to the present invention and removed from the chamber 64. In this manner, respective capacitor structures according to the present invention may be formed over a plurality of semiconductor substrates. Similarly, the present invention relates to fabrication of a memory cell and, on a larger scale, to fabrication to an array of memory cells on a semiconductor die and to respective arrays of memory cells on a plurality of semiconductor die.

Figure 3:
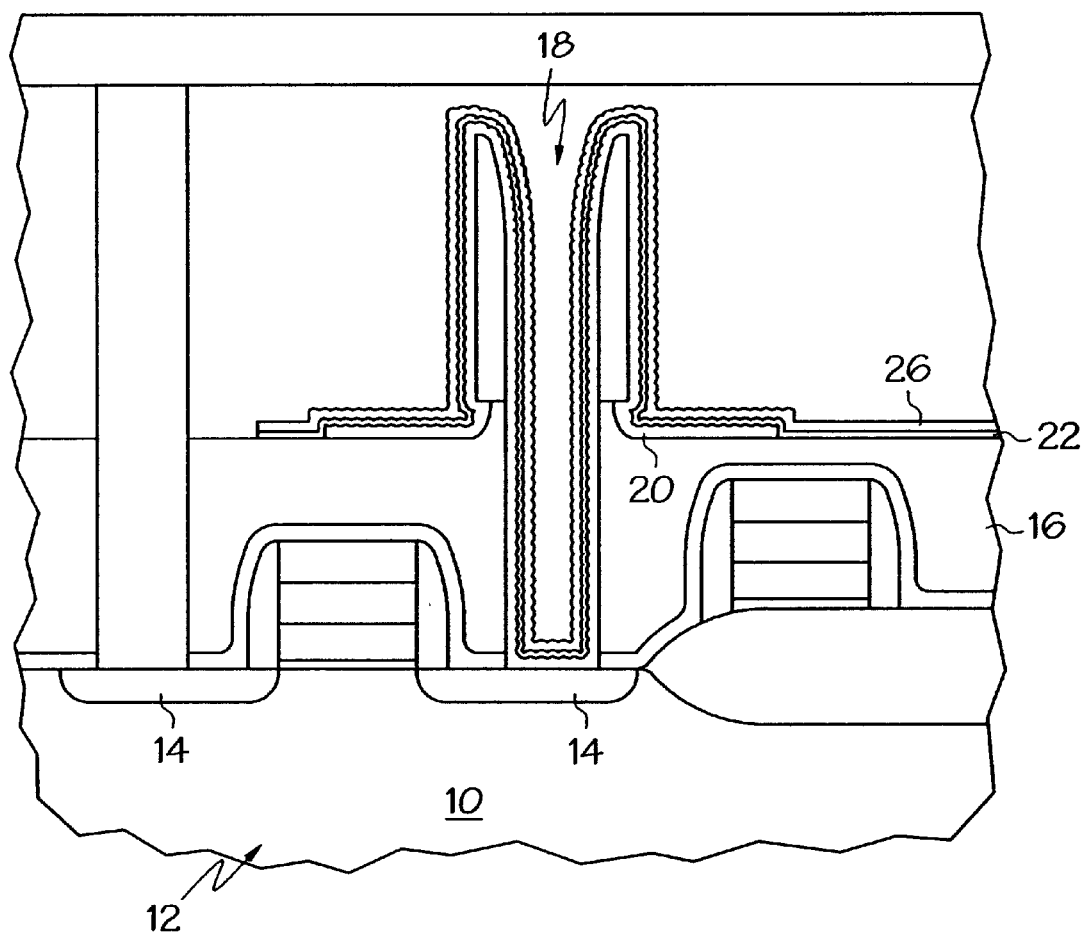
FIG. 3 illustrates a memory cell capacitor structure fabrication scheme according to an alternative embodiment of the present invention.

Although the present invention has been illustrated with reference to the specific memory cell structure of FIGS. 1 and 2, it is contemplated that the present invention is applicable to a variety of memory cell arrangements. For example, FIG. 3, where like structure is indicated with like reference numerals, illustrates the process of the present invention as applied to an alternative memory cell structure.

Figure 4:
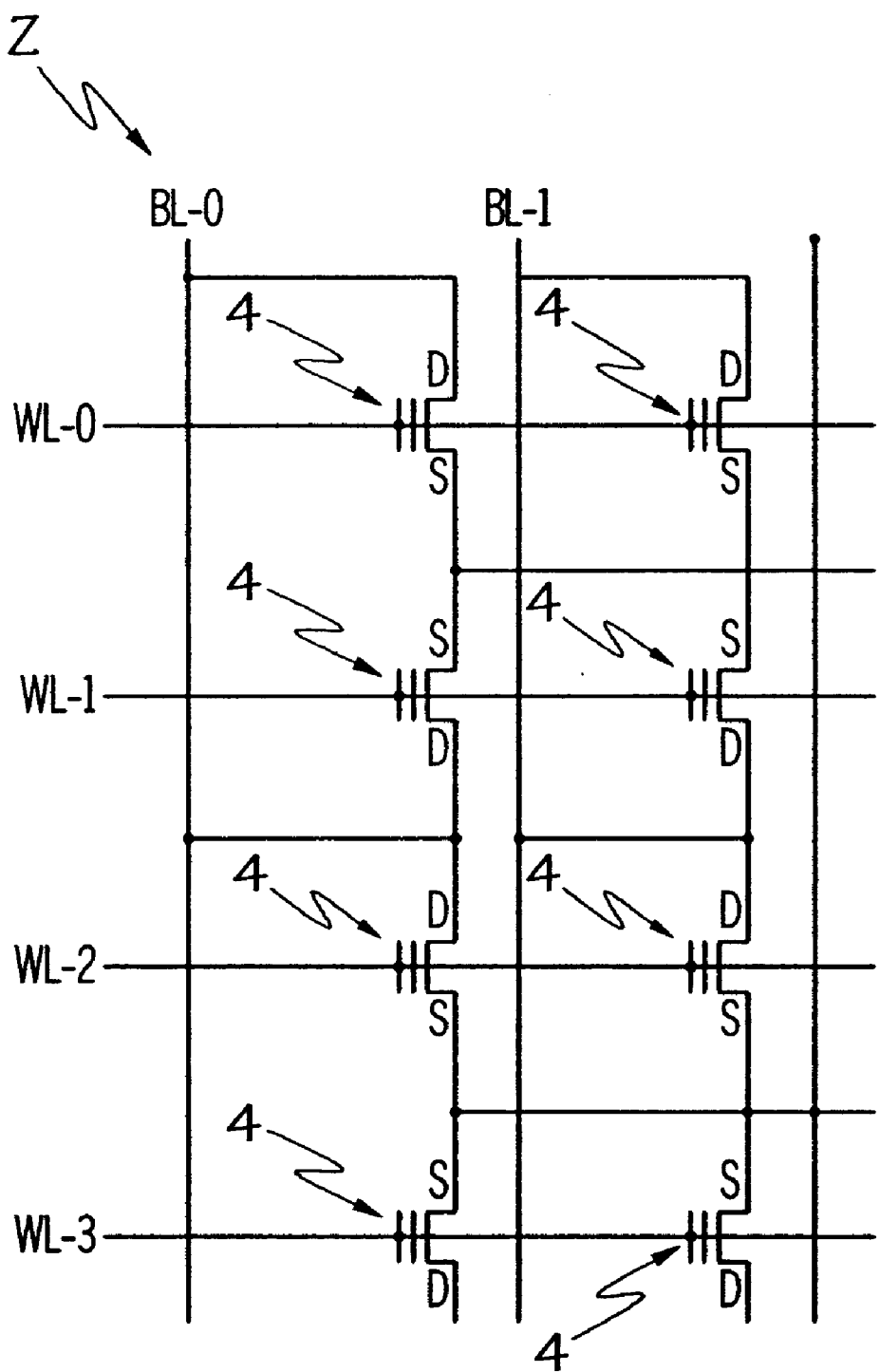
FIG. 4 illustrates a memory cell array.

FIG. 4 illustrates a memory cell array 2. The memory cell array 2 includes a plurality of memory cells 4. Each memory cell 4 includes a capacitor structure and a transistor structure, as discussed above with reference to FIGS. 1–3. Conventional source regions S, drain regions D, bit lines BL, and word lines WL are also illustrated in FIG. 4. It is noted that although the present invention is illustrated with reference to the structures of FIGS. 1–4, the present invention is applicable to a variety of types of memory cell structures and memory array arrangements.

For the purposes of describing and defining the present invention, it is noted that a "semiconductor substrate" denotes any construction comprising a semiconductor material. Examples of semiconductor substrates include semiconductor wafers or other bulk semiconductor materials (either alone or in assemblies comprising other materials), and semiconductor material layers (either alone or in assemblies comprising other materials).

It should be further noted that, for the purposes of defining and describing the present invention, "on" a substrate or layer denotes formation in contact with the surface of the substrate or layer and "over" a substrate or layer denotes formation above or in contact with the surface of the substrate or layer. For the purposes of describing and defining the present invention, it is noted that a layer formed "in" a region or other layer may be formed at a surface of the region/layer or within the region/layer between its upper and lower surfaces. A layer formed "at" a surface of a region/layer may be formed directly on the surface or may be partially embedded in the region/layer so as to define a portion of the surface of the region/layer.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A fabrication process where a capacitor structure is formed over a semiconductor substrate by:
   forming an insulating layer over said semiconductor substrate;
   forming a container in said insulating layer;
   forming a lower electrode layer along an inner surface of said container;
   forming a dielectric layer over said lower electrode layer through an atomic layer deposition process where
      a first precursor is chemisorbed over a surface of said lower electrode layer,
      a second precursor is reacted with said chemisorbed precursor to form said dielectric layer and
      a substantially flat temperature distribution is maintained across said semiconductor substrate as said first precursor is chemisorbed and said precursor is reacted with said chemisorbed precusor; and
   forming an upper electrode layer over said dielectric layer.

2. A fabrication process as claimed in claim 1 wherein said dielectric layer is formed on said lower electrode layer.

3. A fabrication process as claimed in claim 1 wherein said lower electrode layer covers the entire inner surface of said container.

4. A fabrication process as claimed in claim 1 wherein said dielectric layer covers the entire lower electrode layer.

5. A fabrication process as claimed in claim 1 wherein said upper electrode layer covers the entire dielectric layer.

6. A fabrication process as claimed in claim 1 wherein said atomic layer deposition process is characterized by a semiconductor substrate temperature of between about 350 to about 700° C. and a pressure of about 1 to 120 Torr.

7. A fabrication process as claimed in claim 1 wherein said dielectric layer has a uniform thickness of 50 Å or less.

8. A fabrication process where a capacitor structure is formed over a semiconductor substrate by:
   forming an insulating layer over said semiconductor substrate;
   forming a container in said insulating layer;
   forming a lower electrode layer along an inner surface of said container;
   forming a dielectric layer over said lower electrode layer and an upper surface of said insulating layer through an atomic layer deposition process where
      a first precursor is chemisorbed over a surface of said lower electrode layer and an upper surface of said insulating layer,
      a second precursor is reacted with said chemisorbed precursor to form said dielectric layer,
      a substantially flat temperature distribution is maintained across said semiconductor substrate as said first precursor is chemisorbed and said second precursor is reacted with said chemisorbed precursor, and
      said dielectric layer exhibits uniform thickness across said lower electrode layer and said upper surface of said insulating layer;
   forming a reoxidized layer over said dielectric layer by subjecting said dielectric layer to a reoxidation process, wherein said dielectric layer is formed such that said uniform thickness is sufficient to prevent oxidation of said lower electrode layer as a result of said reoxidation process; and
   forming an upper electrode layer over said reoxidized layer.

9. A fabrication process as claimed in claim 8 wherein said dielectric layer is formed in an atomic layer deposition chamber and said reoxidized layer is formed in said chamber or external to said chamber.

10. A fabrication process where a capacitor structure is formed over a semiconductor substrate by:
    forming an insulating layer over said semiconductor substrate;
    forming a container in said insulating layer;
    forming a lower electrode layer along an inner surface of said container;
    forming a silicon nitride dielectric layer over said lower electrode layer through an atomic layer deposition process where a silicon-containing precursor is chemisorbed over a surface of said lower electrode layer and a nitrogen-containing precursor is reacted with said chemisorbed silicon-containing precursor to form said silicon nitride dielectric layer;
    maintaining a substantially flat temperature distribution across said semiconductor substrate as said silicon-containing precursor is chemisorbed and said nitrogen-containing precursor is reacted with said chemisorbed silicon-containing precursor; and
    forming an upper electrode layer over said dielectric layer.

11. A fabrication process as claimed in claim 10 wherein said silicon-containing precursor is selected from $SiCl_4$, $SiHCl_3$, $SiH_2Cl2$, $Si_2H_6$, $SiCl_6$, and $SiH_4$, and combinations thereof and said nitrogen-containing precursor is selected from $NH_3$, $N_2H_2$ and combinations thereof.

12. A fabrication process where a capacitor structure is formed over a semiconductor substrate by:
    forming an BPSG insulating layer over said semiconductor substrate;
    forming a container in said BPSG insulating layer;
    forming a HSG polysilicon lower electrode layer along an inner surface of said container;
    forming a silicon nitride dielectric layer over said HSG lower electrode layer through an atomic layer deposition process where a silicon-containing precursor is chemisorbed over a surface of said HSG lower electrode layer and a nitrogen-containing precursor is reacted with said chemisorbed silicon-containing precursor to form said silicon nitride dielectric layer;
    maintaining a substantially flat temperature distribution across said semiconductor substrate as said silicon-containing precursor is chemisorbed and said nitrogen-containing precursor is reacted with said chemisorbed silicon-containing precursor;
    forming a reoxidation layer over said silicon nitride dielectric layer by subjecting said silicon nitride dielectric layer to a reoxidation process;
    forming an polysilicon upper electrode layer over said reoxidation layer.

13. A fabrication process where a capacitor structure of a memory cell is formed by:
    providing a semiconductor substrate including a semiconductor structure defining a transistor and a pair of transistor node locations;
    forming a BPSG insulating layer over said semiconductor substrate;
    forming a container in said BPSG insulating layer over one of said transistor node locations;
    forming an HSG polysilicon lower electrode layer along an inner surface of said container;
    forming a silicon nitride dielectric layer on said HSG lower electrode layer and over a portion of an upper surface of said BPSG insulating layer though an atomic layer deposition process where said silicon nitride dielectric layer has a thickness of 50 Å or less;
a silicon-containing precursor is chemisorbed over a surface of said HSG lower electrode layer and said portion of said upper surface of said BPSG inslating layer,
a nitrogen-containing precursor is reacted with said chemisorbed silicon-containing precursor to form said silicon nitride dielectric layer,
a substantially flat temperature distribution is maintained across said semiconductor substrate as said silicon-containing precursor is chemisorbed and said nitrogen-containing precursor is reacted with said chemisorbed silicon-containing precursor, and
said silicon nitride dielectric layer exhibits uniform thickness across said HSG lower electrode layer and said portion of said upper surface of said BPSG insulating layer;
forming a reoxidized layer over said silicon nitride dielectric layer by subjecting said silicon nitride dielectric layer to a reoxidation process, wherein said silicon nitride dielectric layer is formed such that said uniform thickness is sufficient to prevent oxidation of said HSG lower electrode layer as a result of said reoxidation process; and
forming a polysilicon upper electrode layer over said reoxidized layer.

14. A fabrication process where respective capacitor structures are formed over a plurality of semiconductor substrates in a multiple wafer batch-type furnace by:
forming respective insulating layers over said semiconductor substrates;
forming respective containers in said insulating layers;
forming respective lower electrode layers along respective inner surfaces of said containers;
forming respective dielectric layers over said lower electrode layers through an atomic layer deposition process where
a first precursor is chemisorbed over a surface of respective lower electrode layers,
a second precursor is reacted with said chemisorbed precursor to form said dielectric layers, and
a substantially flat temperature distribution is maintained across said semiconductor substrates as said first precursor is chemisorbed and said second precursor is reacted with said chemisorbed precursor; and
forming respective upper electrode layers over said dielectric layers.

15. A fabrication process where respective capacitor structures are formed over a plurality of semiconductor substrates in a multiple wafer batch-type furnace by:
forming respective insulating layers over said semiconductor substrates;
forming respective containers in said insulating layers;
forming respective lower electrode layers along respective inner surfaces of said containers;
forming respective dielectric layers over said lower electrode layers through an atomic layer deposition process where
a first precursor is chemisorbed over a surface of respective lower electrode layers,
a second precursor is reacted with said chemisorbed precursor to form said dielectric layers,
said dielectric layer exhibits thickness across said lower electrode layer and an upper surface of said insulating layer, and
a substantially flat temperature division is maintained across said semiconductor substrates as said first precursor is chemisorbed and said second precursor is reacted with said chemisorbed precursor;
forming respective reoxidized layers over said dielectric layers by subjecting said dielectric layers to a reoxidation process, wherein said dielectric layers are formed such that said uniform thickness is sufficient to prevent oxidation of said lower electrode layer as a result of said reoxidation process; and
forming respective upper electrode layers over said reoxidation layers.

16. A fabrication process where respective capacitor structures are formed over a plurality of semiconductor substrates in a multiple wafer batch-type furnace by:
forming respective BPSG insulating layers over said semiconductor substrates;
forming respective containers in said BPSG insulating layers;
forming respective HSG lower electrode layers along respective inner surfaces of said containers;
forming respective silicon nitride dielectric layers over said lower electrode layers through an atomic layer deposition process where
a silicon-containing precursor is chemisorbed over a surface of respective lower electrode layers,
a nitrogen-containing precursor is reacted with said chemisorbed silicon-containing precursor to form said silicon nitride dielectric layers, and
a substantially flat temperature distribution is maintained across said semiconductor substrates as said silicon-containing precursor is chemisorbed and said nitrogen-containing precursor is reacted with said chemisorbed silicon-containing precursor; and
forming respective upper electrode layers over said dielectric layers.

17. A fabrication process where respective capacitor structures are formed over a plurality of semiconductor substrates in a multiple wafer batch-type furnace by:
forming respective BPSG insulating layers over said semiconductor substrates;
forming respective containers in said BPSG insulating layers;
forming respective HSG lower electrode layers along respective inner surfaces of said containers;
forming respective silicon nitride dielectric layers over said HSG lower electrode layers through an atomic layer deposition process where
a silicon-containing precursor is chemisorbed over a surface of respective HSG lower electrode layers,
a nitrogen-containing precursor is reacted with said chemisorbed silicon-containing precursor to form said silicon nitride dielectric layers, and
a substantially flat temperature distribution is maintained across said semiconductor substrates as said silicon-containing precursor is chemisorbed and said nitrogen-containing precursor is reacted with said chemisorbed silicon-containing precursor;
forming respective reoxidized layers over said silicon nitride dielectric layers by subjecting said dielectric layers to a reoxidation process; and
forming respective upper electrode layers over said reoxidized layers.

18. A fabrication process where respective capacitor structures of an array of memory cells are formed in a multiple wafer batch-type furnace by:
providing a plurality of semiconductor substrates including respective semiconductor structures defining a plurality of transistors and respective pairs of transistor node locations;

forming respective BPSG insulating layers over said semiconductor substrates;

forming respective containers in said BPSG insulating layers;

forming respective HSG lower electrode layers along respective inner surfaces of said containers;

forming respective silicon nitride dielectric layers over said HSG lower electrode layers and a portion of respective upper surfaces of said BPSG insulating layers through an atomic layer deposition process where wherein said dielectric layer has a uniform thickness of 50 Å or less, a silicon-containing precursor is chemisorbed over a surface of respective HSG lower electrode layers and said portions of respective upper surfaces of said BPSG insulating layers, a nitrogen-containing precursor is reacted with said chemisorbed silicon-containing precursor to form said silicon nitride dielectric layers, a substantially flat temperature distribution is maintained across said semiconductor substrates as said silicon-containing precursor is chemisorbed and said nitrogen-containing precursor is reacted with said chemisorbed silicon-containing precursor, and said silicon nitride dielectric layer exhibits uniform thickness across said HSG lower electrode layer and said portion of said upper surface of said BPSG insulating layer;

forming respective reoxidized layers over said dielectric layers by subjecting said dielectric layers to a reoxidation process, wherein said dielectric layers are formed such that said uniform thickness is sufficient to prevent oxidation of said lower electrode layer as a result of said reoxidation process; and forming respective upper electrode layers over said reoxidized layers.

19. A fabrication process where a memory cell is formed by:

providing a semiconductor substrate including a semiconductor structure defining a transistor and a pairs of transistor node locations;

forming an insulating layer over said semiconductor substrate;

forming a container in said insulating layer over one of said transistor node locations;

forming a lower electrode layer along an inner surface of said container;

forming a silicon nitride dielectric layer over said lower electrode layer and a portion of an upper surface of said insulating layer through an atomic layer deposition process where a silicon-containing precursor is chemisorbed over a surface of said lower electrode layer and said portion of said upper surface of said insulating layer, a nitrogen-containing precursor is reacted with said chemisorbed silicon-containing precursor to form said silicon nitride dielectric layer, a substantially flat temperature distribution is maintained across said semiconductor substrate as said silicon-containing precursor is chemisorbed and said nitrogen-containing precursor is reacted with said chemisorbed silicon-containing precursor, and said silicon nitride dielectric layer exhibits uniform thickness across said lower electrode layer and said portion of said upper surface of said insulating layer, forming a reoxidized layer over said dielectric layer by subjecting said dielectric layer to a reoxidation process, wherein said dielectric layer is formed such that said uniform thickness is sufficient to prevent oxidation of said lower electrode layer as a result of said reoxidation process; and forming an upper electrode layer over said reoxidized layer.

20. A fabrication process where an array of memory cells are formed on a semiconductor die by:

providing a semiconductor substrate including a semiconductor structure defining a plurality of transistors and respective pairs of transistor node locations;

forming an insulating layer over said semiconductor substrate;

forming respective containers in said insulating layer over selected ones of said transistor node locations;

forming respective lower electrode layer along inner surfaces of selected ones of said containers;

forming respective silicon nitride dielectric layers over said lower electrode layer and a portion of an upper surface of said insulating layer through an atomic layer deposition process where a silicon-containing precursor is chemisorbed over a surface of said lower electrode layer and said portion of said upper surface of said insulating layer, a nitrogen-containing precursor is reacted with said chemisorobed silicon-containing precursor to form said silicon nitride dielectric layer, a substantially flat temperature distribution is maintained across said semiconductor substrate as said silicon containing precursor is chemisorbed and said nitrogen-containing precursor is reacted with said chemisorbed silicon-containing precursor, and said silicon nitride dielectric layer exhibits uniform thickness across said lower electrode layer and said portion of said upper surface of said insulating layer;

forming a reoxidized layer over said dielectric layer by subjecting said dielectric layer to a reoxidation process, wherein said dielectric layer is formed such that said uniform thickness is sufficient to prevent oxidation of said lower electrode layer as a result of said reoxidation process; and forming an upper electrode layer over said reoxidized layer.

21. A fabrication process where an array of memory cells are formed on a plurality of semiconductor die in a multiple wafer batch-type furnace by:

providing a plurality of semiconductor substrates including respective semiconductor structures defining a plurality of transistors and respective pairs of transistor node locations;

forming respective insulating layers over said semiconductor substrates;

forming respective containers in said insulating layers over selected ones of said transistor node locations;

forming respective lower electrode layers along inner surfaces of selected ones of said containers;

forming respective silicon nitride dielectric layers over said lower electrode layer and a portion of an upper surface of said insulating layers through an atomic layer deposition process where a silicon-containing precursor is chemisorbed over a surface of said lower electrode layer and said portion of said upper surface of said insulating layer, a nitrogen-containing precursor is reacted with said chemisorbed silicon-containing precursor to form said silicon nitride dielectric layer, said silicon nitride dielectric layer exhibits uniform thickness across said lower electrode layer and said portion of said upper surface of said insulating layer, and a substantially flat temperature distribution is maintained across said semiconductor substrates as said silicon-containing precursor is chemisorbed and said nitrogen-containing precursor is reacted with said chemisorbed silicon-containing precursor;

forming respective reoxidized layers over said dielectric layers by subjecting said dielectric layers to a reoxidation process, wherein said dielectric layers are formed such that said uniform thickness is sufficient to prevent oxidation of said lower electrode layer as a result of said reoxidation process; and forming respective upper electrode layers over said reoxidized layers.

* * * * *

UNITED STATES PATENT AND TRADEMARK OFFICE
CERTIFICATE OF CORRECTION

PATENT NO. : 6,551,893 B1
DATED : April 22, 2003
INVENTOR(S) : Zheng et al.

It is certified that error appears in the above-identified patent and that said Letters Patent is hereby corrected as shown below:

Column 6,
Line 30, reads as "forming an BPSG", should read -- forming a BPSG --.
Line 34, reads as "forming a HSG", should read -- forming an HSG --.
Line 36, reads as "layer over said HSG", should read -- layer on said HSG --.
Line 48, reads as "forming a reoxidation", should read -- forming a reoxidized --.
Line 52, reads as "said reoxidation layer", should read -- said reoxidized layer --.

Column 7,
Line 65, reads as "exhibits thickness", should read -- exhibits uniform thickness --.

Column 8,
Line 1, reads as "temperature division", should read -- temperature distribution -- .
Line 15, reads as "respective BPSG insulating", should read -- respective insulating --.
Line 17, reads as "in said BPSG insulating", should read -- in said insulating --.
Line 19, reads as "respective HSG lower", should read -- respective lower --.

Column 9,
Line 13, reads as "wherein said", should read -- said --.
Line 67, reads as "layer,", should read -- layer; --.

Column 10,
Line 18, reads as "electrode layer", should read -- electrode layers --.
Line 32, reads as "silicon containing", should read -- silicon-containing --.

Signed and Sealed this

Thirtieth Day of March, 2004

JON W. DUDAS
*Acting Director of the United States Patent and Trademark Office*